United States Patent
Lin et al.

(10) Patent No.: US 8,604,477 B2
(45) Date of Patent: Dec. 10, 2013

(54) PIXEL STRUCTURE AND MANUFACTURING METHOD THEREOF

(75) Inventors: Wu-Hsiung Lin, Hsinchu (TW); Po-Hsueh Chen, Taoyuan County (TW); Shin-Shueh Chen, Hsinchu County (TW); Guang-Ren Shen, Yunlin County (TW); Jia-Hong Ye, Taipei County (TW)

(73) Assignee: Au Optronics Corporation, Hsinchu (TW)

( * ) Notice: Subject to any disclaimer, the term of this patent is extended or adjusted under 35 U.S.C. 154(b) by 253 days.

(21) Appl. No.: 13/089,298

(22) Filed: Apr. 18, 2011

(65) Prior Publication Data

US 2012/0138932 A1   Jun. 7, 2012

(30) Foreign Application Priority Data

Dec. 1, 2010   (TW) ................................ 99141790 A

(51) Int. Cl.
*H01L 29/04*   (2006.01)
*H01L 29/10*   (2006.01)
*H01L 31/00*   (2006.01)

(52) U.S. Cl.
USPC .......................................................... 257/59

(58) Field of Classification Search
USPC .......................................................... 257/59
See application file for complete search history.

(56) References Cited

U.S. PATENT DOCUMENTS

| | | | |
|---|---|---|---|
| 7,212,255 B2 | 5/2007 | Chung | |
| 2002/0085134 A1 | 7/2002 | Chung | |
| 2006/0258078 A1* | 11/2006 | Lee et al. | ........................ 438/216 |
| 2009/0212291 A1 | 8/2009 | Ikeda | |
| 2009/0283762 A1 | 11/2009 | Kimura | |
| 2010/0109004 A1 | 5/2010 | Arai | |
| 2010/0140613 A1 | 6/2010 | Kimura | |
| 2010/0208156 A1 | 8/2010 | Liu | |
| 2011/0024740 A1* | 2/2011 | Yamazaki et al. | ............... 257/43 |
| 2011/0024750 A1* | 2/2011 | Yamazaki et al. | ............... 257/57 |
| 2011/0255154 A1* | 10/2011 | Nagase et al. | ................ 359/352 |

FOREIGN PATENT DOCUMENTS

| | | |
|---|---|---|
| CN | 1363920 A | 8/2002 |
| CN | 101807586 A | 8/2010 |

OTHER PUBLICATIONS

Takahiro Hiramatsu, Mamoru Furuta, Tokiyoshi Matsuda, Chaoyang Li, Takashi Hirao, Behavior of oxygen in zinc oxide films through thermal annealing and its effect on sheet resistance, Applied Surface Science, vol. 257, Issue 13, Apr. 15, 2011, pp. 5480-5483.*

* cited by examiner

*Primary Examiner* — Phat X Cao
*Assistant Examiner* — Diana C Vieira
(74) *Attorney, Agent, or Firm* — Jianq Chyun IP Office

(57) ABSTRACT

A pixel structure and a manufacturing method thereof are provided. In the pixel structure, an electrode of a storage capacitor is formed when an active layer is formed, and the electrode and the active layer are made of the same material. The material of the electrode and the active layer can be an oxide semiconductor with high transmittance. Therefore, a stable display frame of the pixel structure can be provided by the storage capacitor, an aperture ratio of the pixel structure can be improved, and power consumption can be further reduced.

21 Claims, 11 Drawing Sheets

PIXEL STRUCTURE AND MANUFACTURING METHOD THEREOF

CROSS-REFERENCE TO RELATED APPLICATION

This application claims the priority benefit of Taiwan application serial no. 99141790, filed Dec. 1, 2010. The entirety of the above-mentioned patent application is hereby incorporated by reference herein and made a part of this specification.

BACKGROUND OF THE INVENTION

1. Field of the Invention

The invention relates to a pixel structure and a manufacturing method thereof, and particularly to a pixel structure having a storage capacitor and a manufacturing method of the pixel structure.

2. Description of Related Art

By virtue of the increasing demands for displays and the rising awareness of environmental protection, a thin film transistor liquid crystal display (TFT-LCD) featuring superior properties including high definition, optimal space utilization, low power consumption, and no radiation has gradually become the mainstream product in the market of the displays. To comply with the users' requirements for high contrast ratio, no gray scale inversion, little color shift, high luminance, full color, high color saturation, fast response speed, stable display frames, and wide viewing angle, the TFT-LCD that satisfies said requirements has been developing.

In general, the TFT-LCD mainly includes two substrates and a liquid crystal layer sandwiched between the two substrates. A pixel array is configured on one of the substrates, and a color filter array is configured on the other. FIG. 1 is a cross-sectional view illustrating a pixel structure of a conventional TFT-LCD. The pixel structure 100 includes a TFT 110, a pixel electrode 120, and a lower electrode 130 of a storage capacitor. The pixel electrode 120 is electrically connected to the TFT 110. The lower electrode 130 of the storage capacitor and the pixel electrode 120 together form the storage capacitor for stabilizing the display frames of the pixel structure 100.

Nonetheless, the conventional lower electrode 130 of the storage capacitor and the gate 112 of the TFT 110 are made of the same metal layer, which results in the reduction of the aperture ratio of the pixel structure 100. When the pixel structure 100 is applied to a transmissive LCD, the light emission efficacy of the backlight source needs to be improved for maintaining the display luminance to some extent, which leads to additional power consumption.

SUMMARY OF THE INVENTION

The invention is directed to a pixel structure that includes a storage capacitor and can maintain the aperture ratio.

The invention is further directed to a manufacturing method of said pixel structure.

In an embodiment of the invention, a pixel structure that includes a substrate, a scan line, a gate, a gate insulating layer, an active layer, a blocking layer, a capacitor electrode, a source electrode, a drain electrode, a data line, a common line, a passivation layer, and a pixel electrode is provided. The scan line is configured on the substrate. The gate is configured on the substrate and electrically connected to the scan line. The gate insulating layer is configured on the substrate and covers the gate and the scan line. The active layer is configured on the gate insulating layer and correspondingly located above the gate. The active layer includes a source region, a drain region, and a channel region located between the source region and the drain region. Sheet resistance of the source region and sheet resistance the drain region are respectively lower than sheet resistance of the channel region. The blocking layer is configured on the channel region of the active layer and exposes the source region and the drain region. The capacitor electrode is configured on the gate insulating layer. The source electrode is located on the gate insulating layer and electrically connected to the source region of the active layer. The drain electrode is located on the gate insulating layer and electrically connected to the drain region of the active layer. The data line is configured on the gate insulating layer and electrically connected to the source electrode. An extension direction of the data line intersects an extension direction of the scan line. The common line is configured on the gate insulating layer and connected to the capacitor electrode. The passivation layer is configured on the gate insulating layer. The passivation layer covers the active layer, the blocking layer, the capacitor electrode, the source electrode, the drain electrode, the data line, and the common line. Besides, the passivation layer has a contact window that exposes the drain electrode. The pixel electrode is configured on the passivation layer. Here, the pixel electrode is electrically connected to the drain electrode via the contact window.

According to an embodiment of the invention, an extension direction of the common line is substantially parallel to the extension direction of the data line.

According to an embodiment of the invention, the source electrode and the drain electrode cover a portion of the active layer, and the common line covers a portion of the capacitor electrode.

According to an embodiment of the invention, the active layer covers a portion of the source electrode and a portion of the drain electrode, and the capacitor electrode covers a portion of the common line.

In an embodiment of the invention, a manufacturing method of a pixel structure is further provided. The manufacturing method includes following steps. A substrate is provided. A first patterned metal layer is formed on the substrate. The first patterned metal layer includes a scan line and a gate, and the gate is electrically connected to the scan line. A gate insulating layer is formed on the substrate, and the gate insulating layer covers the gate and the scan line. A patterned semiconductor layer is formed on the gate insulating layer. The patterned semiconductor layer includes an active layer and a capacitor electrode. The active layer is correspondingly located above the gate, and the active layer includes a source region, a drain region, and a channel region located between the source region and the drain region. A blocking layer is formed on the channel region of the active layer, and the blocking layer exposes the source region and the drain region. An annealing process is performed on the source region and the drain region of the active layer, and on the capacitor electrode with use of the blocking layer as a mask, such that sheet resistance of the source region and sheet resistance of the drain region are respectively lower than sheet resistance of the channel region. A second patterned metal layer is formed on the gate insulating layer. The second patterned metal layer includes a data line, a common line, a source electrode, and a drain electrode. The source electrode is electrically connected to the source region of the active layer. The drain electrode is electrically connected to the drain region of the active layer. The data line is electrically connected to the source electrode. The data line intersects the scan line. The common line is electrically connected to the capacitor electrode. A passivation layer is formed on the gate insulating layer, and the passivation layer covers the active layer, the blocking layer, the capacitor electrode, the source electrode, the drain electrode, the data line, and the common line. A contact window is formed in the passivation layer, and the contact window exposes the drain electrode. A pixel electrode is formed on the passivation layer, and the pixel electrode is electrically connected to the drain electrode via the contact window.

According to an embodiment of the invention, an extension direction of the common line is substantially parallel to an extension direction of the data line.

According to an embodiment of the invention, the patterned semiconductor layer is formed before the second patterned metal layer is formed.

According to an embodiment of the invention, the patterned semiconductor layer is formed after the second patterned metal layer is formed.

According to an embodiment of the invention, the annealing process includes an excimer laser annealing (ELA) process or a plasma annealing process.

According to an embodiment of the invention, the capacitor electrode and the active layer are formed by patterning the same transparent material layer.

According to an embodiment of the invention, the transparent material layer is an oxide semiconductor layer, for example, and a material of the oxide semiconductor layer includes indium gallium zinc oxide (IGZO), indium zinc oxide (IZO), indium gallium oxide (IGO), zinc oxide (ZnO), $2CdO.GeO_2$, or $NiCo_2O_4$. According to an embodiment of the invention, a material of the blocking layer comprises SiOx, SiNx, TiOx, $In_2O_3$, $InGaO_3$, InGaZnO, $SnO_2$, ZnO, $Zn_2In_2O_5$, argentums (Ag), $ZnSnO_3$, $Zn_2SnO_4$, amorphous silicon (a-Si), or a combination thereof.

According to an embodiment of the invention, the blocking layer has a transmittance rate ranging from about 2% to about 10% in response to a light having a wavelength of about 308 nm.

According to an embodiment of the invention, the blocking layer has a transmittance rate of about 4% when the light having the wavelength of about 308 nm passes the blocking layer.

According to an embodiment of the invention, the sheet resistance of the source region and the sheet resistance of the drain region are lower than about $10^4\Omega/\square$, respectively, and the sheet resistance of the channel region is higher than about $10^{12}\Omega/\square$.

Based on the above, the pixel structure described herein is different from the conventional pixel structure because the electrode of the storage capacitor and the active layer can be made of the same material when the active layer is formed. Here, the material of the electrode and the active layer can be an oxide semiconductor material with high transmittance. As such, a stable display frame of the pixel structure can be provided by the storage capacitor, an aperture ratio of the pixel structure can be improved, and power consumption can be further reduced.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this disclosure. The drawings illustrate exemplary embodiments and, together with the description, serve to explain the principles of the disclosure.

DESCRIPTION OF EMBODIMENTS

Figure 1:
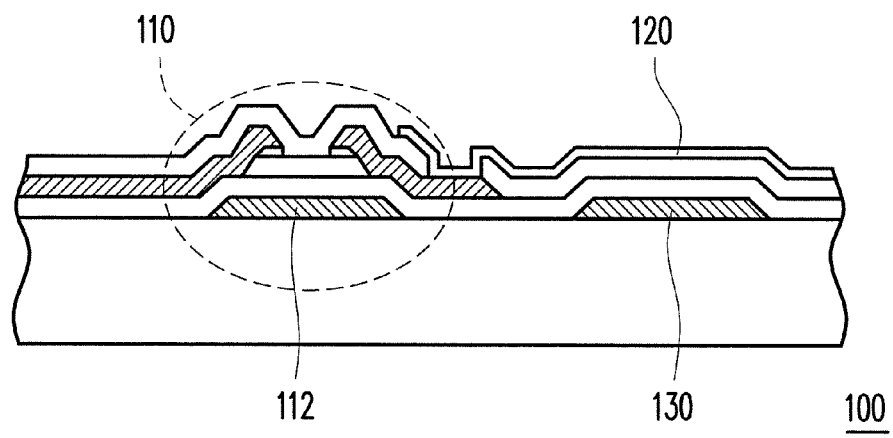
FIG. 1 is a cross-sectional view illustrating a pixel structure of a conventional TFT-LCD.
Figure 2:
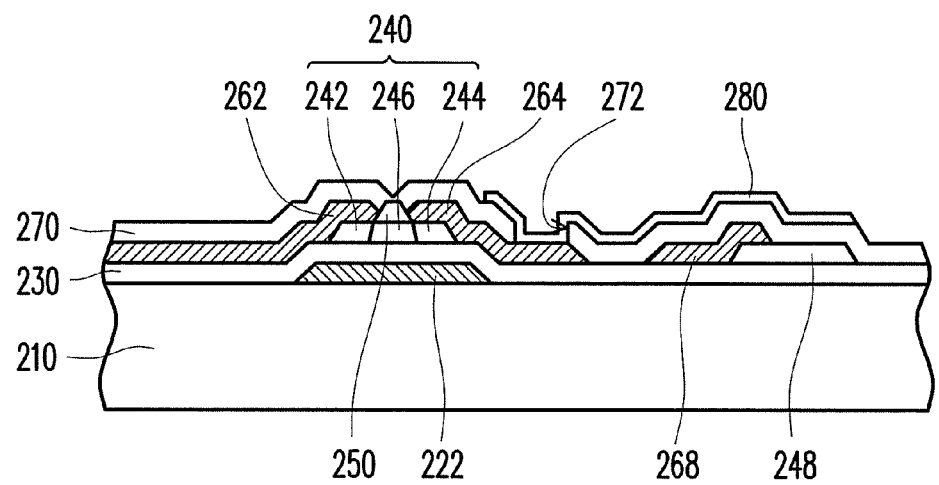
FIG. 2 illustrates a pixel structure according to an embodiment of the invention.
Figure 3:
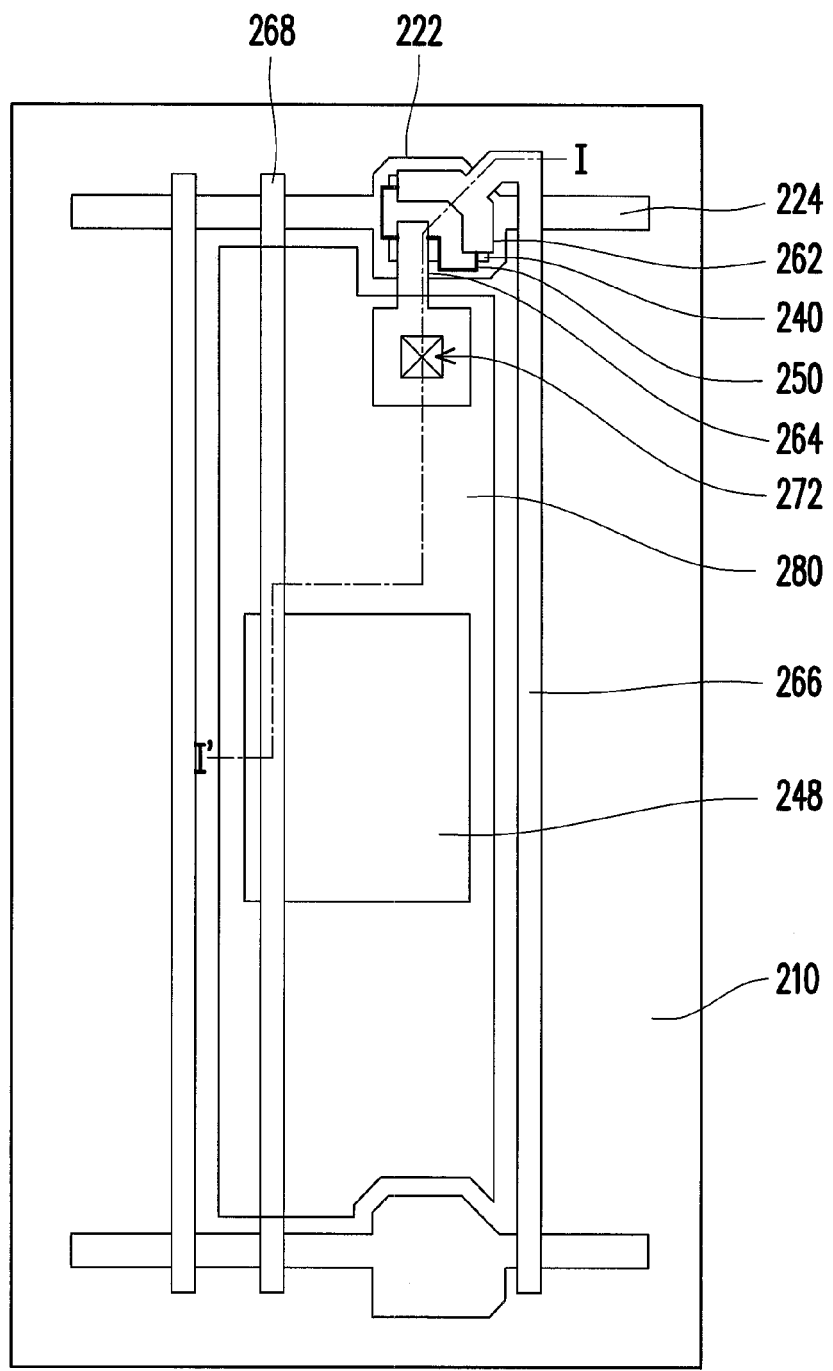
FIG. 3 is a top view illustrating the pixel structure depicted in FIG. 2.

FIG. 2 illustrates a pixel structure according to an embodiment of the invention. FIG. 3 is a top view illustrating the pixel structure depicted in FIG. 2. As indicated in FIG. 2 and FIG. 3, a gate 222 and a scan line 224 are configured on a substrate 210, and the gate 222 is electrically connected to the scan line 224. In this embodiment, the substrate 210 is exemplarily made of a transparent material, such as glass, plastic, and so on. A gate insulating layer 230 is configured on the substrate 210 and covers the gate 222 and the scan line 224. An active layer 240 is configured on the gate insulating layer 230 and correspondingly located above the gate 222. A material of the active layer 240 is, for instance, an oxide semiconductor material, such as IGZO, InGaZnO, IZO, IGO, ZnO, $2CdO.GeO_2$, or $NiCo_2O_4$, and the active layer 240 includes a source region 242, a drain region 244, and a channel region 246 that have different sheet resistances. The channel region 246 is located between the source region 242 and the drain region 244, and the sheet resistance of the source region 242 and the sheet resistance of the drain region 244 are respectively lower than the sheet resistance of the channel region 246. For instance, the sheet resistance of the source region 242 and the sheet resistance of the drain region 244 can be respectively lower than about $10^4\Omega/\square$, and the sheet resistance of the channel region 246 is higher than about $10^{12}\Omega/\square$.

With reference to FIG. 2 and FIG. 3, a blocking layer 250 is configured on the channel region 246 of the active layer 240 and exposes the source region 242 and the drain region 244. According to this embodiment, a material of the blocking layer 250 is SiOx, SiNx, TiOx, $In_2O_3$, $InGaO_3$, InGaZnO, $SnO_2$, ZnO, $Zn_2In_2O_5$, Ag, $ZnSnO_3$, $Zn_2SnO_4$, a-Si, or a combination thereof. The blocking layer 250 can serve as a mask when an annealing process is performed on the active layer 240. Namely, the source region 242, the drain region 244, and the channel region 246 are formed in a self-alignment manner. The annealing process of this embodiment can be an ELA process or a plasma annealing process. The blocking layer 250 can alleviate the degree of irradiating the channel region 246 with laser or bombarding the channel region 246 with plasma, such that the sheet resistance of the channel region 246 is higher than the sheet resistance of the source 242 and the sheet resistance of the drain region 244, respectively. To be more specific, when the annealing process is preformed with use of the excimer laser having the wavelength of about 308 nm, the blocking layer 250 can have a transmittance rate ranging from about 2% to about 10% in response to a light having a wavelength of about 308 nm.

The capacitor electrode 248 is configured on the gate insulating layer 230. In an alternative embodiment, the capacitor electrode 248 and the active layer 240 can be formed by patterning the same transparent material layer. In particular, the annealing process can be performed on the active layer 240 and on transparent material pattern, wherein the capacitor electrode 248 is formed by the transparent material pattern. Thereby, the capacitor electrode 248 and the source and drain regions 242 and 244 of the active layer 240 have the same material characteristics, e.g., the same low sheet resistance.

In addition, a source electrode 262 and a drain electrode 264 are located on the gate insulating layer 230 and electrically connected to the source region 242 and the drain region 244 of the active layer 240, respectively. The data line 266 is configured on the gate insulating layer 230 and electrically connected to the source electrode 262. An extension direction of the data line 266 intersects an extension direction of the scan line 224. The common line 268 is configured on the gate insulating layer 230 and connected to the capacitor electrode 248. In this embodiment, the source electrode 262, the drain electrode 264, the data line 266, and the common line 268 are formed by patterning the same metal layer. An extension direction of the common line 268 is substantially parallel to the extension direction of the data line 266. The source electrode 262 and the drain electrode 264 cover a portion of the active layer 240, so as to respectively connect the source region 242 and the drain region 244 of the active layer 240. The common line 268 covers a portion of the capacitor electrode 248.

The passivation layer 270 is configured on the gate insulating layer 230 and covers the active layer 240, the blocking layer 250, the capacitor electrode 248, the source electrode 262, the drain electrode 264, the data line 266, and the common line 268. Besides, the passivation layer 270 has a contact window 272 that exposes at least a portion of the drain electrode 264. The pixel electrode 280 is configured on the passivation layer 270 and electrically connected to the drain electrode 264 via the contact window 272.

In the pixel structure of this embodiment, the active layer 240 and the capacitor electrode 248 can be simultaneously made of an oxide semiconductor material with high transmittance. The storage capacitor can be formed by the capacitor electrode 248 and the pixel electrode 280 to stabilize the display frames of the pixel structure. Besides, the capacitor electrode 248 has high transmittance, which is conducive to the improvement of the aperture ratio of the pixel structure. That is to say, appropriate display luminance can be provided in no need of improving the light emission efficacy of the backlight source, and thus additional power consumption is not required.

The manufacturing method of the aforesaid pixel structure is exemplarily described hereinafter. FIG. 4A to FIG. 4F are cross-sectional views sequentially illustrating the manufacturing process of the pixel structure. FIG. 5A to FIG. 5E are top views illustrating the manufacturing process.

Figure 4A:
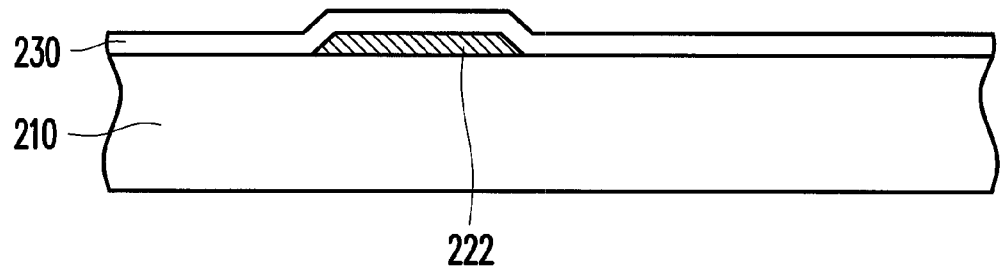
FIG. 4A to FIG. 4F sequentially illustrate a manufacturing process of a pixel structure according to an embodiment of the invention.
Figure 5A:
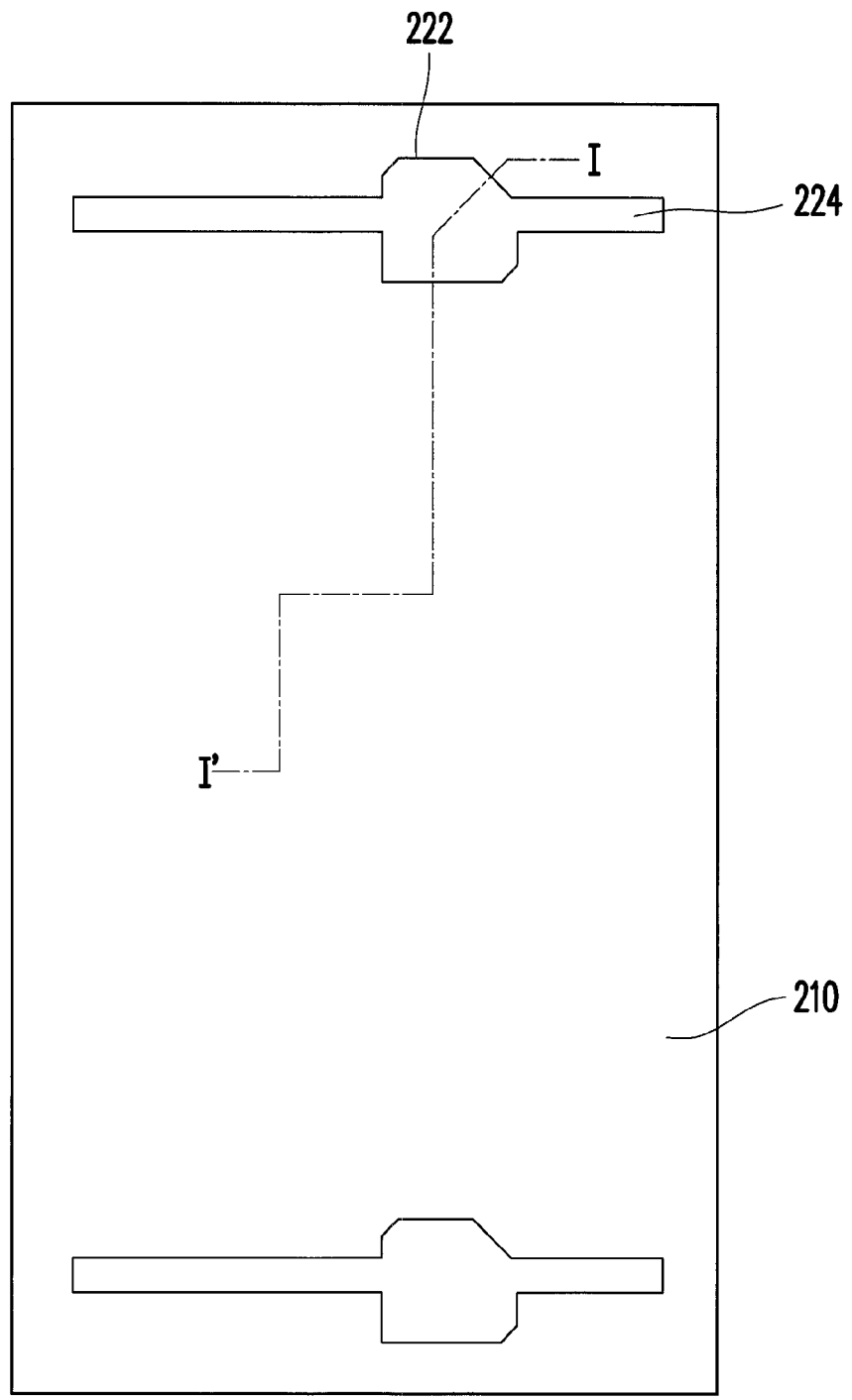
FIG. 5A to FIG. 5E are top views illustrating the manufacturing process depicted in FIG. 4A to FIG. 4F.

First, as shown in FIG. 4A and FIG. 5A, the substrate 210 is provided, and a first patterned metal layer is formed on the substrate 210. The first patterned metal layer is formed by performing a deposition process on the entire substrate 210 to form a metal material layer and patterning the metal material layer. The first patterned metal layer includes the gate 222 and the scan line 224, as shown in the drawings. Here, the gate 222 is electrically connected to the scan line 224. Besides, the gate insulating layer 230 is formed on the substrate 210, such that the gate insulating layer 230 covers the gate 222 and the scan line 224.

Figure 4B:
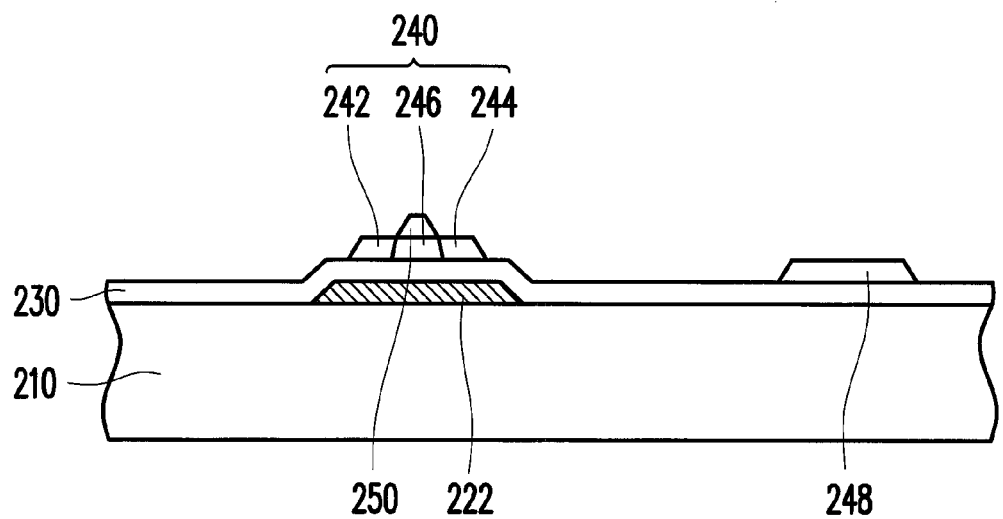

As indicated in FIG. 4B, a patterned semiconductor layer is formed on the gate insulating layer 230. Here, the patterned semiconductor layer is formed by performing a deposition process on the entire gate insulating layer 230 to form a transparent semiconductor material layer and patterning the semiconductor material layer. A material of the semiconductor material layer includes an oxide semiconductor material, such as IGZO, IZO, IGO, ZnO, $2CdO.GeO_2$, or $NiCo_2O_4$. In this embodiment, the patterned semiconductor layer includes the active layer 240 and the capacitor electrode 248. Here, the active layer 240 is correspondingly located above the gate 222, and the active layer 240 is divided into the source region 242, the drain region 244, and the channel region 246 located between the source region 242 and the drain region 244.

Figure 4C:
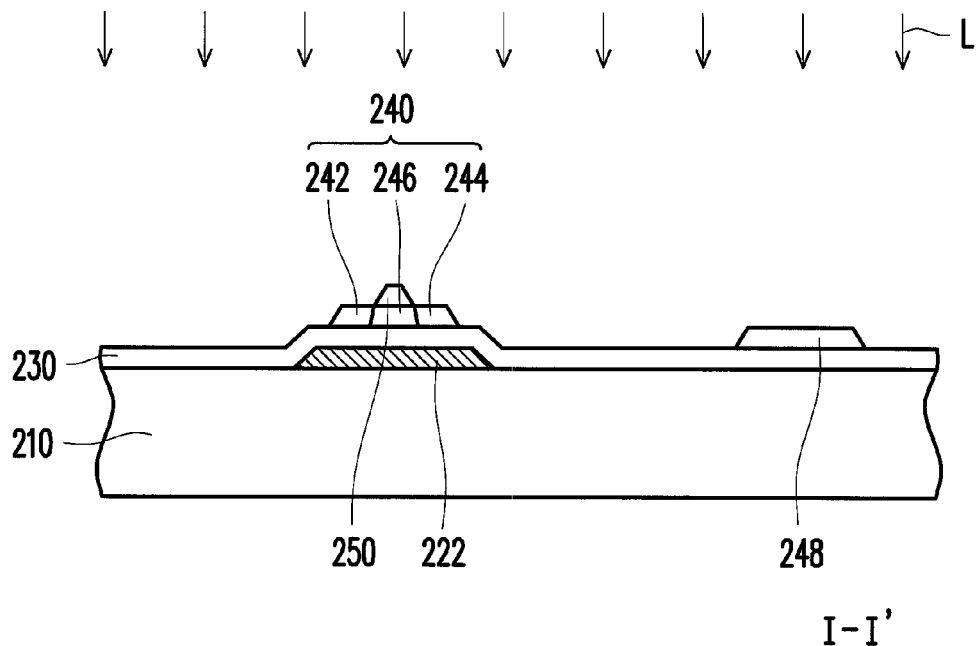
Figure 5B:
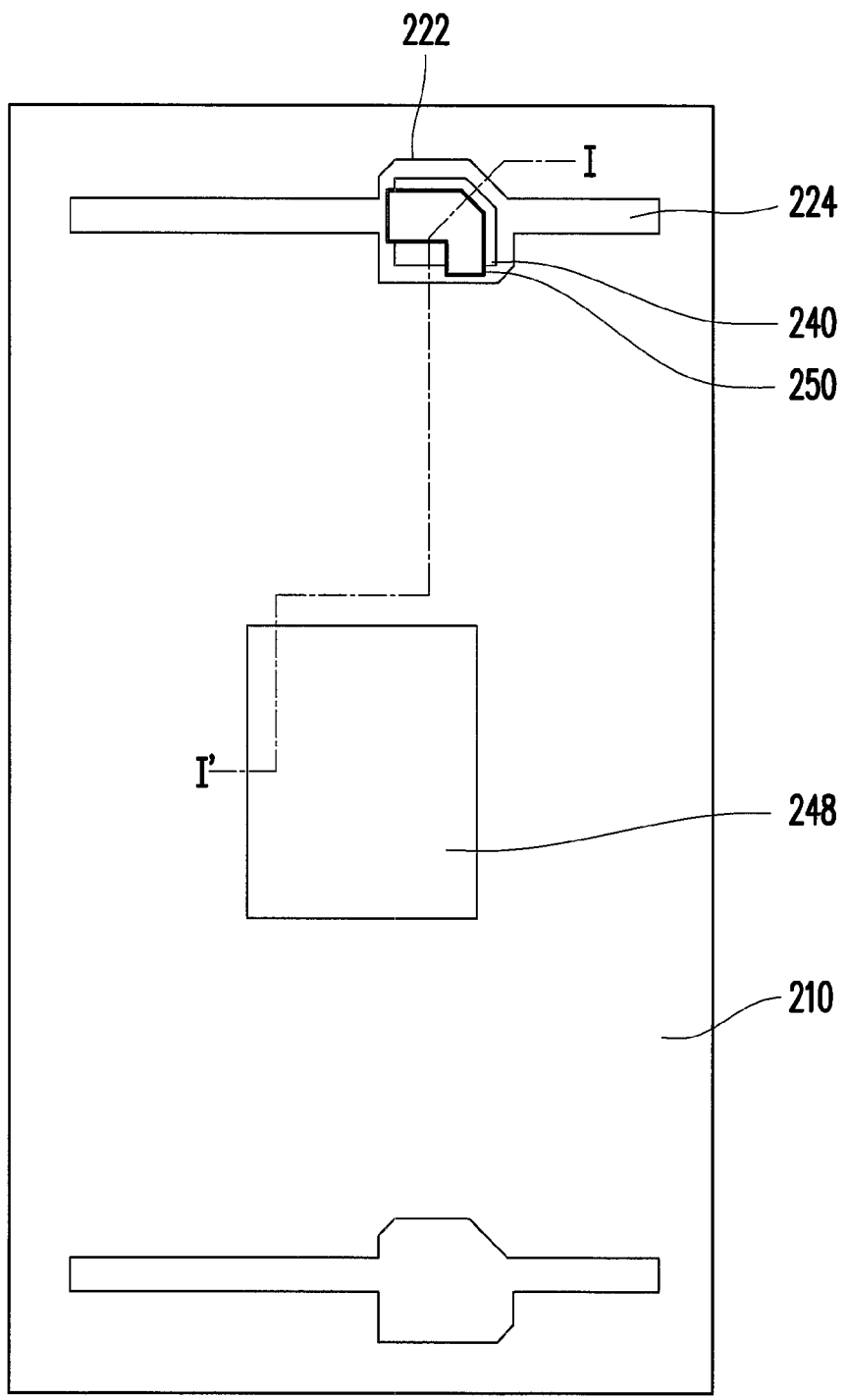

As indicated in FIG. 4C and FIG. 5B, the blocking layer 250 is formed on the channel region 246 of the active layer 240, and the blocking layer 250 exposes the source region 242 and the drain region 244. An annealing process is performed on the source region 242 and the drain region 244 of the active layer 240 and on the capacitor electrode 248 with use of the blocking layer 250 as a mask. The sheet resistance of the source region 242, the sheet resistance of the drain region 244, and the sheet resistance of the capacitor electrode 248 can be lowered down by performing the annealing process, such that the source region 242, the drain region 244, and the capacitor electrode 248 can be equipped with electric conductivity. Here, the annealing process is an ELA process, for instance. Namely, the active layer 240 and the capacitor electrode 248 are irradiated by excimer laser L. A material of the blocking layer 250 includes SiOx, SiNx, TiOx, $In_2O_3$, $InGaO_3$, InGaZnO, $SnO_2$, ZnO, $Zn_2In_2O_5$, Ag, $ZnSnO_3$, $Zn_2SnO_4$, a-Si, or a combination thereof.

On the other hand, when the wavelength of the excimer laser L is about 308 nm, for instance, the blocking layer 250 can be made of the material which has a transmittance rate ranging from about 2% to about 10% in response to a light having the wavelength of about 308 nm. For instance, the blocking layer 250 can have the transmittance rate of about 4% in response to a light having the wavelength of about 308 nm. In other words, the blocking layer 250 of this embodiment still allows a small quantity of the excimer laser L to pass. Therefore, not only the source region 242, the drain region 244, and the capacitor electrode 248 that are not covered by the blocking layer 250 react with the excimer laser L, but also the channel region 246 that is covered by the blocking layer 250 is irradiated by a small quantity of the excimer laser L. As such, the material characteristics of the channel region 246 can be improved by means of the excimer laser L. Said material characteristics include carrier mobility and sub-threshold swing (ss). Due to different degrees of irradiation, the sheet resistance of the source region 242, the sheet resistance of the drain region 244, and the sheet resistance of the capacitor electrode 248 are respectively lower than the sheet resistance of the channel region 246. For instance, the sheet resistance of the source region 242, the sheet resistance of the drain region 244, and the sheet resistance of the capacitor electrode 248 are respectively lower than about $10^4 \Omega/\square$, and the sheet resistance of the channel region 246 is higher than about $10^{12} \Omega/\square$.

Certainly, in an embodiment of the invention, the ELA process can be replaced by any other appropriate process, such as an $H_2$ plasma annealing process.

Figure 4D:
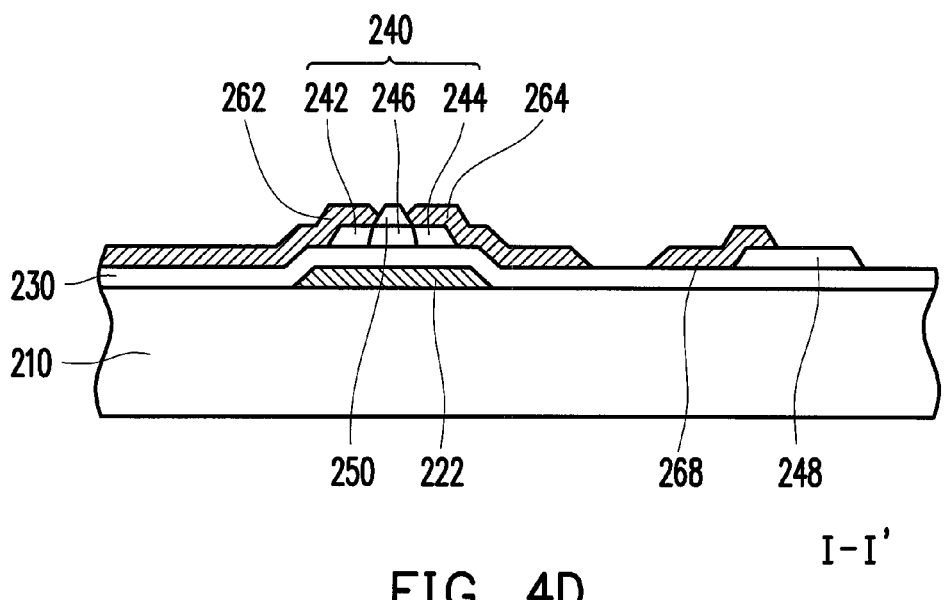
Figure 5C:
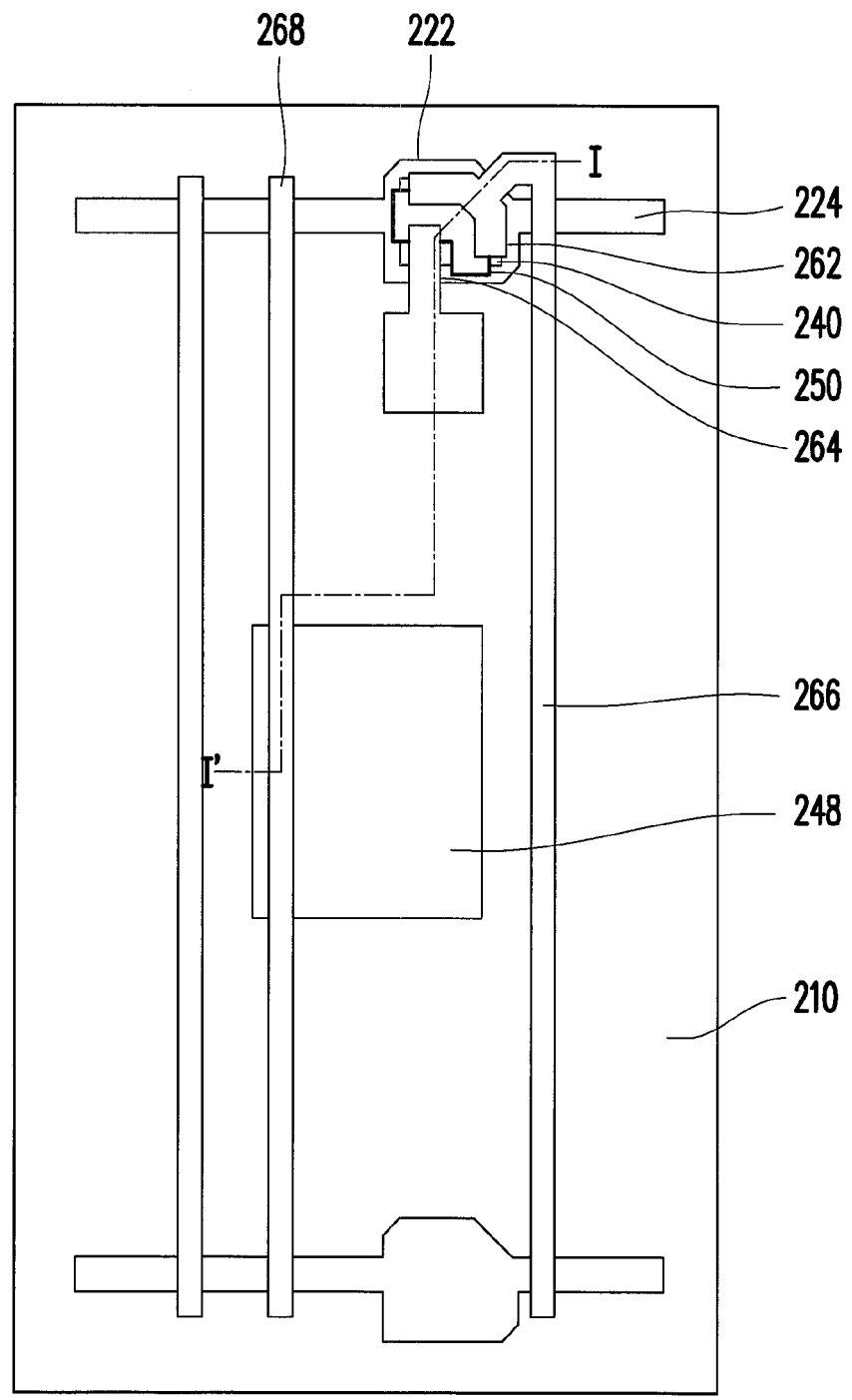

As shown in FIG. 4D and FIG. 5C, a second patterned metal layer is formed on the gate insulating layer 230. The second patterned metal layer is formed by performing a deposition process on the entire gate insulating layer 230 to form a metal material layer and patterning the metal material layer. The second patterned metal layer includes the data line 266, the common line 268, the source electrode 262, and the drain electrode 264, as indicated in the drawings. The source electrode 262 is electrically connected to the source region 242 of the active layer 240. The drain electrode 264 is electrically connected to the drain region 244 of the active layer 240. The data line 266 is electrically connected to the source electrode 262, and the extension direction of the data line 266 intersects the extension direction of the scan line 224. The common line 268 is electrically connected to the capacitor electrode 248, and the extension direction of the common line 268 is substantially parallel to the extension direction of the data line 266, for instance.

Figure 4E:
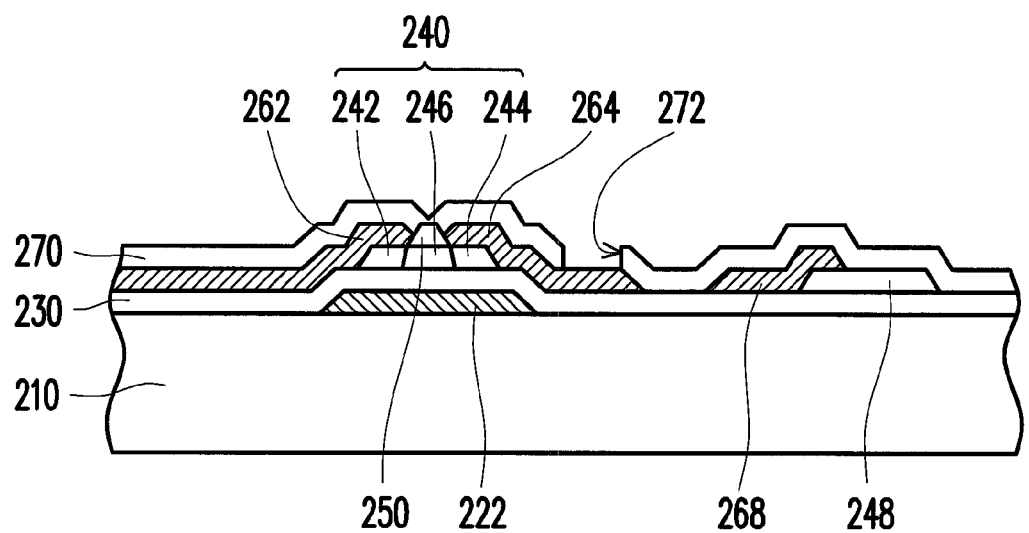
Figure 5D:
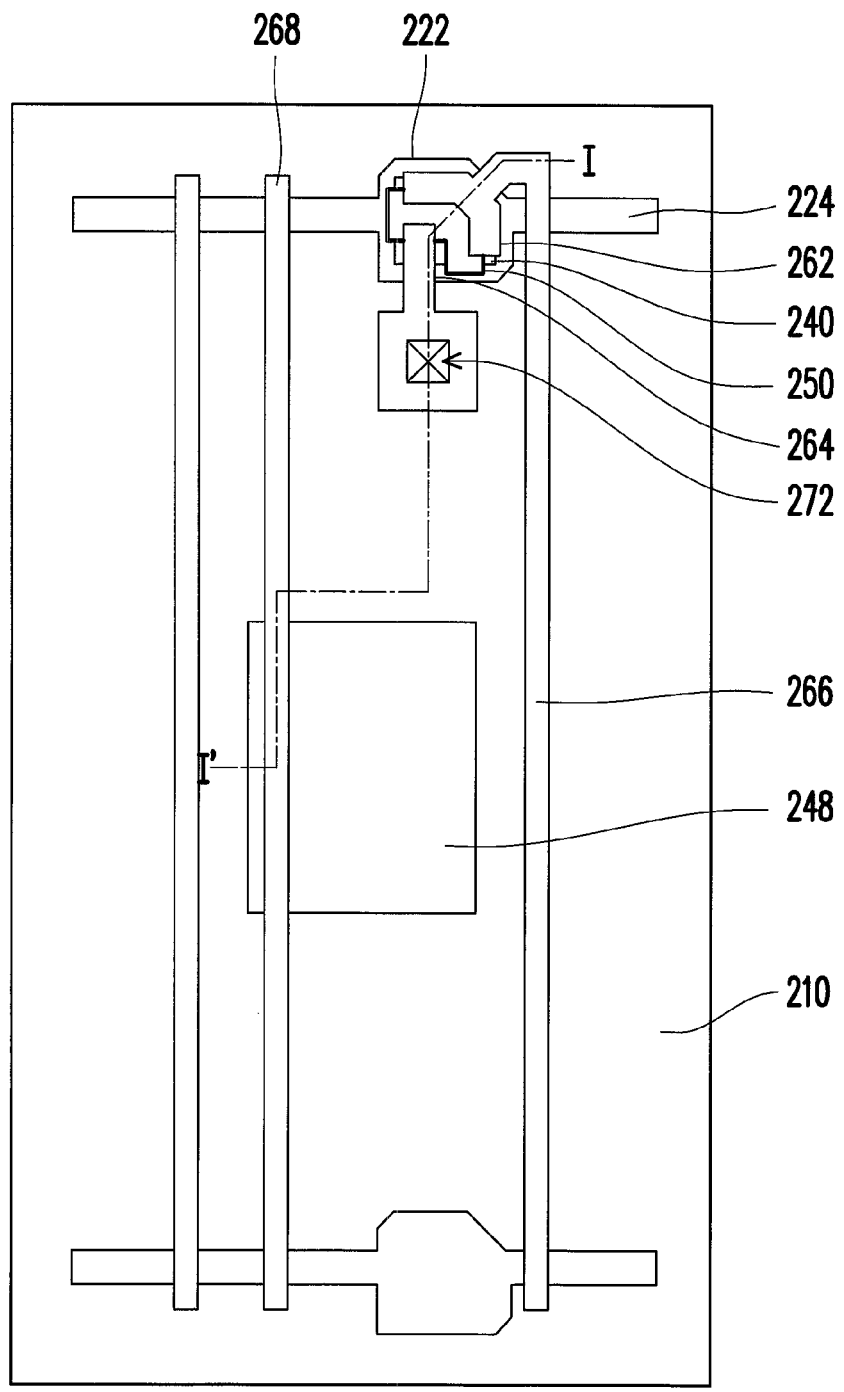

As shown in FIG. 4E and FIG. 5D, the passivation layer 270 is formed on the gate insulating layer 230 to cover the active layer 240, the blocking layer 250, the capacitor electrode 248, the source electrode 262, the drain electrode 264, the data line 266, and the common line 268. The contact window 272 is formed in the passivation layer 270 and exposes the drain electrode 264.

Figure 4F:
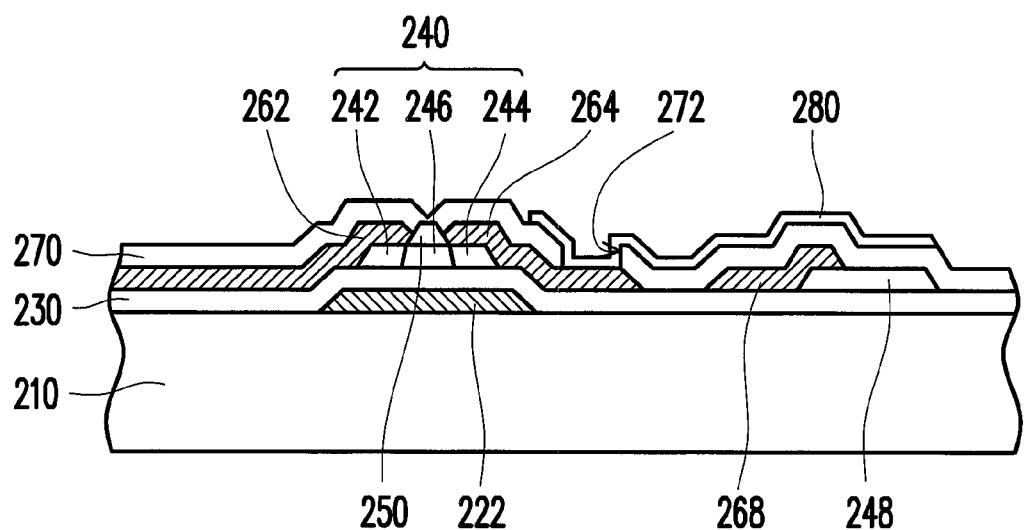
Figure 5E:
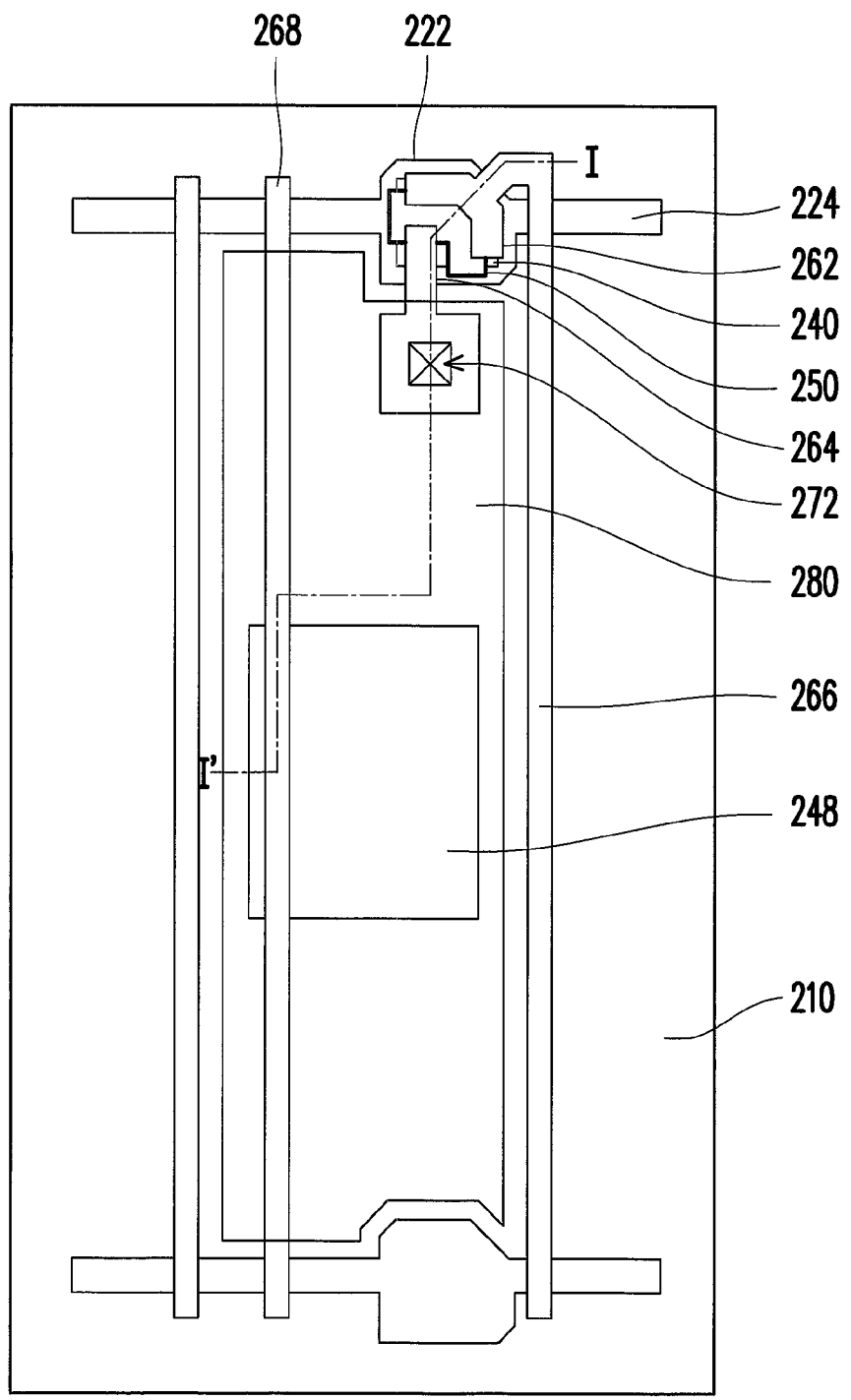

With reference to FIG. 4F and FIG. 5E, the pixel electrode 280 is formed on the passivation layer 270, such that the pixel electrode 280 is electrically connected to the drain electrode 264 via the contact window 272. The storage capacitor can be formed by the capacitor electrode 248 and the pixel electrode 280 to stabilize the display frames of the pixel structure. Besides, the capacitor electrode 248 has high transmittance, which is conducive to the improvement of the aperture ratio of the pixel structure.

Figure 6:
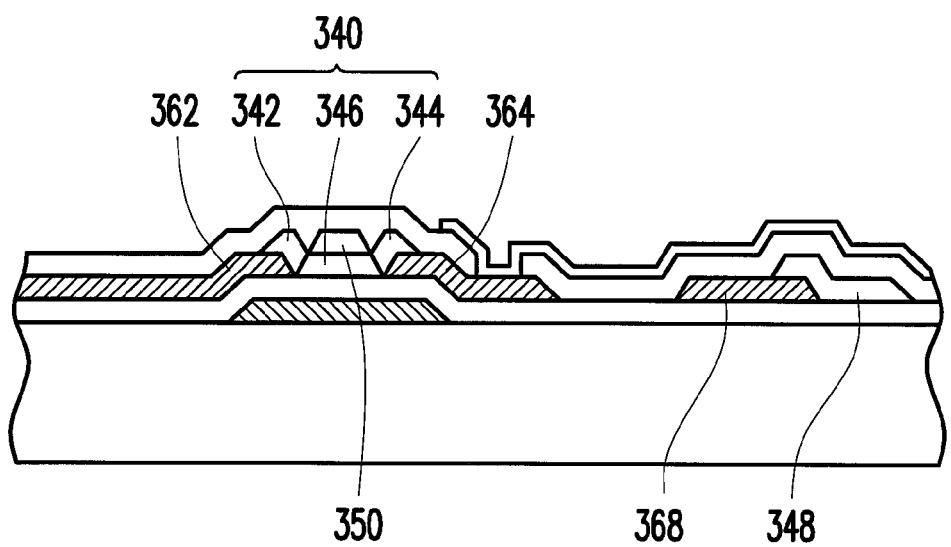
FIG. 6 illustrates a pixel structure according to another embodiment of the invention.

In the previous embodiments, the patterned semiconductor layer is formed, as indicated in FIG. 4B, FIG. 4C, and FIG. 5B, and the second patterned metal layer is formed, as shown in FIG. 4D and FIG. 5C. However, in other embodiments of the invention, the step of forming the second patterned metal layer (shown in FIG. 4D and FIG. 5C) can be performed before the step of forming the patterned semiconductor layer is performed (shown in FIG. 4B, FIG. 4C, and FIG. 5B). FIG. 6 illustrates the pixel structure formed by performing this manufacturing process. The pixel structure shown in FIG. 6 is similar to the pixel structure shown in FIG. 2, while the difference therebetween lies in that the active layer 340 (including the source region 342, the drain region 344, and the channel region 346) in FIG. 6 cover a portion of the source electrode 362 and a portion of the drain electrode 364, and that the capacitor electrode 348 covers a portion of the common line 368. Descriptions of other elements as shown in FIG. 6 can be referred to as those in FIG. 2 and FIG. 3, and thus no other descriptions are given herein.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A pixel structure comprising:
   a substrate;
   a scan line configured on the substrate;
   a gate configured on the substrate and electrically connected to the scan line;
   a gate insulating layer configured on the substrate and covering the gate and the scan line;
   an active layer configured on the gate insulating layer and correspondingly located above the gate, the active layer comprising a source region, a drain region, and a channel region located between the source region and the drain region, wherein sheet resistance of the source region and sheet resistance the drain region are respectively lower than sheet resistance of the channel region;
   a blocking layer configured on the channel region of the active layer and exposing the source region and the drain region;
   a capacitor electrode configured on the gate insulating layer;
   a source electrode located on the gate insulating layer and electrically connected to the source region of the active layer;
   a drain electrode located on the gate insulating layer and electrically connected to the drain region of the active layer;
   a data line configured on the gate insulating layer and electrically connected to the source electrode, an extension direction of the data line intersecting an extension line of the scan line;
   a common line configured on the gate insulating layer and connected to the capacitor electrode, wherein an extension direction of the common line is substantially parallel to the extension direction of the data line;
   a passivation layer configured on the gate insulating layer and covering the active layer, the blocking layer, the capacitor electrode, the source electrode, the drain electrode, the data line, and the common line, the passivation layer having a contact window exposing at least a portion of the drain electrode; and
   a pixel electrode configured on the passivation layer, the pixel electrode being electrically connected to the drain electrode via the contact window.

2. The pixel structure as claimed in claim 1, wherein the source electrode and the drain electrode cover a portion of the active layer, and the common line covers a portion of the capacitor electrode.

3. The pixel structure as claimed in claim 2, wherein the source electrode and the drain electrode contact the sides of the active layer.

4. The pixel structure as claimed in claim 1, wherein the active layer covers a portion of the source electrode and a portion of the drain electrode, and the capacitor electrode covers a portion of the common line.

5. The pixel structure as claimed in claim 1, the capacitor electrode and the active layer are formed by patterning one transparent material layer.

6. The pixel structure as claimed in claim 5, wherein the transparent material layer comprises an oxide semiconductor layer.

7. The pixel structure as claimed in claim 6, wherein a material of the oxide semiconductor layer comprises indium gallium zinc oxide, indium zinc oxide, indium gallium oxide, zinc oxide, $2CdO.GeO_2$, or $NiCo_2O_4$.

8. The pixel structure as claimed in claim 1, wherein a material of the blocking layer comprises $SiO_x$, $SiN_x$, $TiO_x$, $In_2O_3$, $InGaO_3$, $InGaZnO$, $SnO_2$, $ZnO$, $Zn_2In_2O_5$, argentum, $ZnSnO_3$, $Zn_2SnO_4$, amorphous silicon, or a combination thereof.

9. The pixel structure as claimed in claim 1, wherein the blocking layer has a transmittance rate ranging from 2% to 10% in response to a light having a wavelength of 308 nm.

10. The pixel structure as claimed in claim 1, wherein the sheet resistance of the source region and the sheet resistance of the drain region are respectively lower than about $10^4 \Omega/\square$, and the sheet resistance of the channel region is higher than about $10^{12} \Omega/\square$.

11. A manufacturing method of a pixel structure, comprising:
   providing a substrate;

forming a first patterned metal layer on the substrate, the first patterned metal layer comprising a scan line and a gate, the gate being electrically connected to the scan line;

forming a gate insulating layer on the substrate, the gate insulating layer covering the gate and the scan line;

forming a patterned semiconductor layer on the gate insulating layer, the patterned semiconductor layer comprising an active layer and a capacitor electrode, wherein the active layer is correspondingly located above the gate, and the active layer comprises a source region, a drain region, and a channel region located between the source region and the drain region;

forming a blocking layer on the channel region of the active layer, the blocking layer exposing the source region and the drain region;

performing an annealing process on the source region and the drain region of the active layer and on the capacitor electrode with use of the blocking layer as a mask;

forming a second patterned metal layer on the gate insulating layer, the second patterned metal layer comprising a data line, a common line, a source electrode, and a drain electrode, the source electrode being electrically connected to the source region of the active layer, the drain electrode being electrically connected to the drain region of the active layer, the data line being electrically connected to the source electrode, the data line intersecting the scan line, the common line being electrically connected to the capacitor electrode;

forming a passivation layer on the gate insulating layer, the passivation layer covering the active layer, the blocking layer, the capacitor electrode, the source electrode, the drain electrode, the data line, and the common line;

forming a contact window in the passivation layer, the contact window exposing at least a portion of the drain electrode; and forming a pixel electrode on the passivation layer, the pixel electrode being electrically connected to the drain electrode via the contact window.

12. The manufacturing method as claimed in claim 11, wherein an extension direction of the common line is substantially parallel to an extension direction of the data line.

13. The manufacturing method as claimed in claim 11, wherein the patterned semiconductor layer is formed before the second patterned metal layer is formed.

14. The manufacturing method as claimed in claim 11, wherein the patterned semiconductor layer is formed after the second patterned metal layer is formed.

15. The manufacturing method as claimed in claim 11, wherein the patterned semiconductor layer comprises an oxide semiconductor layer.

16. The manufacturing method as claimed in claim 15, wherein a material of the oxide semiconductor layer comprises indium gallium zinc oxide, indium zinc oxide, indium gallium oxide, zinc oxide, 2CdO.GeO2, or NiCo2O4.

17. The manufacturing method as claimed in claim 11, wherein the annealing process comprises an excimer laser annealing process or a plasma annealing process.

18. The manufacturing method as claimed in claim 11, wherein a material of the blocking layer comprises SiOx, SiNx, TiOx, In2O3, InGaO3, InGaZnO, SnO2, ZnO, Zn2In2O5, argentum, ZnSnO3, Zn2SnO4, amorphous silicon, or a combination thereof.

19. The manufacturing method as claimed in claim 11, wherein the blocking layer has a transmittance rate ranging from 2% to 10% in response to a light having a wavelength of 308 nm.

20. The manufacturing method as claimed in claim 11, wherein the sheet resistance of the source region and the sheet resistance of the drain region are respectively lower than about $10^4 \Omega/\square$, and the sheet resistance of the channel region is higher than about $10^{12} \Omega/\square$.

21. The manufacturing method as claimed in claim 11, wherein the source electrode and the drain electrode contact the sides of the active layer.

\* \* \* \* \*